United States Patent
Cheng et al.

(10) Patent No.: US 9,148,149 B2
(45) Date of Patent: Sep. 29, 2015

(54) FLIP-FLOP CIRCUIT WITH RESISTIVE POLY ROUTING

(71) Applicants: Zhihong Cheng, Suzhou (CN); Peidong Wang, Suzhou (CN)

(72) Inventors: Zhihong Cheng, Suzhou (CN); Peidong Wang, Suzhou (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/176,025

(22) Filed: Feb. 7, 2014

(65) Prior Publication Data

US 2014/0285236 A1 Sep. 25, 2014

(30) Foreign Application Priority Data

Mar. 25, 2013 (CN) .......................... 2013 1 0272473

(51) Int. Cl.
*H03K 3/289* (2006.01)
*H03K 19/094* (2006.01)
*H03K 3/3562* (2006.01)

(52) U.S. Cl.
CPC ...... *H03K 19/09429* (2013.01); *H03K 3/35625* (2013.01)

(58) Field of Classification Search
CPC ............. G11C 11/412; G11C 11/4125; H01L 21/76831; H03D 13/004; H03K 3/0375; H03K 3/356156; H03K 3/35625
USPC ...................................................... 326/56–58
See application file for complete search history.

(56) References Cited

U.S. PATENT DOCUMENTS

| | | | |
|---|---|---|---|
| 4,951,112 A | 8/1990 | Choi | |
| 5,311,070 A * | 5/1994 | Dooley | 327/208 |
| 6,005,806 A * | 12/1999 | Madurawe et al. | 365/185.23 |
| 6,242,957 B1 * | 6/2001 | Uemura | 327/202 |
| 6,445,236 B1 * | 9/2002 | Bernard et al. | 327/202 |
| 6,703,881 B2 | 3/2004 | Lu | |
| 6,831,485 B2 * | 12/2004 | Lee et al. | 327/2 |
| 6,847,543 B2 * | 1/2005 | Toyoda et al. | 365/154 |
| 7,391,250 B1 * | 6/2008 | Chuang | 327/211 |
| 7,405,606 B2 | 7/2008 | Kok | |
| 7,590,900 B2 * | 9/2009 | Kim et al. | 714/724 |
| 7,718,482 B2 * | 5/2010 | Ekbote et al. | 438/200 |
| 7,772,906 B2 * | 8/2010 | Naffziger | 327/203 |
| 8,648,392 B2 * | 2/2014 | Nishimura et al. | 257/206 |
| 8,742,796 B2 * | 6/2014 | Dally et al. | 327/51 |
| 8,880,965 B2 * | 11/2014 | Zhang et al. | 714/726 |
| 2007/0052466 A1 | 3/2007 | Kim | |

OTHER PUBLICATIONS

Eilhard Haseloff, "Metastable Response in 5-V Logic Circuits", Texas Instruments, SDYA006, Feb. 1997.

(Continued)

*Primary Examiner* — Alexander H Taningco
*Assistant Examiner* — Kurtis R Bahr
(74) *Attorney, Agent, or Firm* — Charles Bergere

(57) ABSTRACT

A latch circuit has a tri-state gate and a reverse tri-state gate that share the same complementary controls. The reverse tri-state gate locks an output of the tri-state gate when the tri-state gate is shut-off. The complementary control signals include a first undoped polysilicon strip. The output of the reverse tri-state gate may be coupled to the output of the tri-state gate via a second undoped polysilicon strip.

9 Claims, 5 Drawing Sheets

(56) References Cited

OTHER PUBLICATIONS

Stojanovic, V. and Oklobdzija, V., "Comparative Analysis of Master-Slave Latches and Flip-Flops for High-Performance and Low-Power Systems", IEEE Journal of Solid-State Circuits, vol. 34, No. 4, Apr. 1999, pp. 536-548.

Ko, Uming and Belsara, Poras T., "High-Performance Energy-Efficient D-Flip-Flop Circuits", IEEE Transactions on Very Large Scale Integration (VLSI) Systems, vol. 8, No. 1, Feb. 2000, pp. 94-98.

\* cited by examiner

FLIP-FLOP CIRCUIT WITH RESISTIVE POLY ROUTING

BACKGROUND OF THE INVENTION

The present invention relates generally to integrated circuits, and more particularly, to a flip-flop circuit having resistive poly routing.

Flip-Flop (FF) performance is a crucial factor for high performance SOCs, not just in terms of functional operation, but also for layout and routing. Reducing metal connections inside a FF cell, which is replicated many times within a chip, can make available more metal routing tracks over the FFs, which allows for higher SOC routability.

A conventional master-slave FF (MS-FF) includes two latches with each latch holding data by using a feedback loop. The design of a MS-FF gives rise to at last two issues. First, the feedback loop will slow data changing from one state to another. Second, the internal inverted clock and non-inverted clock are not aligned with each other, which causes a relatively large setup and hold time.

It would be advantageous to have a FF design that overcomes the above-mentioned issues.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

Figure 1:
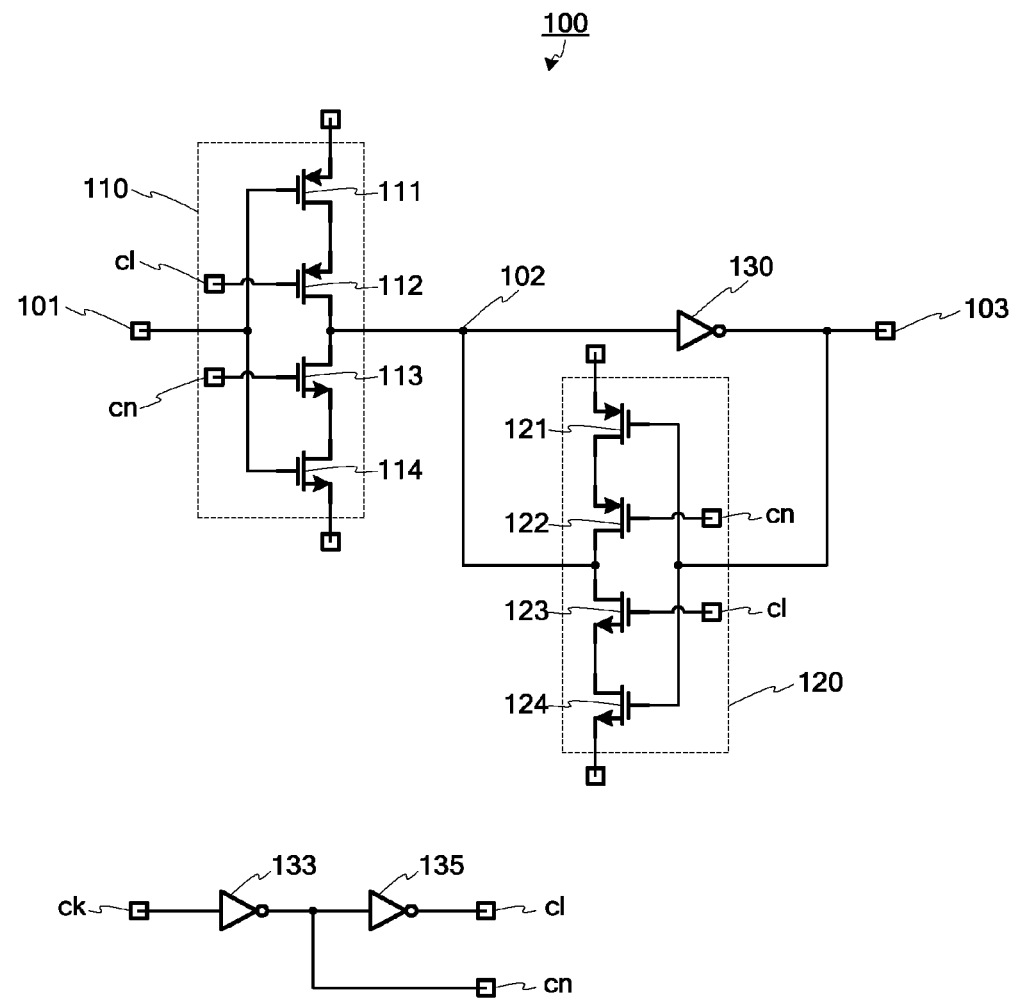
FIG. 1 is a schematic circuit diagram of a conventional latch circuit.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

The present invention resolves the two issues mentioned above by providing a FF circuit including resistors implemented with resistive poly wiring (e.g., non-silicide poly that typically is ~1 kohm/square). The FF circuit has a shorter clock to Q delay (CQ delay), better set-up and hold times, and less metal wiring, which allows for more metal routing tracks left for SOC place and route).

In one embodiment, the present invention provides a latch circuit comprising a tri-state gate and a reverse tri-state gate that share complementary control signals. The reverse tri-state gate is configured to lock an output of the tri-state gate when the tri-state gate is shut-off. The complementary control signals are generated using a first undoped polysilicon strip. The output of the reverse tri-state gate is coupled to the output of the tri-state gate via a second undoped polysilicon strip. The first and second undoped polysilicon strips can be formed within the doped polysilicon connections by adding a mask process without changing the circuit layout design.

In another embodiment, the present invention provides a flip-flop circuit comprising a first latch circuit and a second latch circuit. The first latch circuit includes a first tri-state gate and a first reverse tri-state gate that uses the same complementary control signals as the first tri-state gate. The first reverse tri-state gate is configured to lock an output of the first tri-state gate when the first tri-state gate is shut-off. The second latch circuit is connected in series with the first latch circuit and includes a second tri-state gate and a second reverse tri-state gate that uses the same complementary control signals as the first tri-state gate. The second tri-state gate is configured to be of an on/off state opposite to the first tri-state gate, and the second reverse tri-state gate is configured to lock an output of the second tri-state gate when the second tri-state gate is shut-off. The complementary control signals are generated using a first undoped polysilicon strip. The output of the first reverse tri-state gate also may be coupled to the output of the first tri-state gate via a second undoped polysilicon strip. Further, the output of the second reverse tri-state gate may be coupled to the output of the second tri-state gate via a third undoped polysilicon strip. The first, second and third undoped polysilicon strips may be formed within the doped polysilicon connections by adding a mask process without changing the layout design of the circuit.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

Referring now to FIG. 1, a schematic circuit diagram of a conventional latch circuit 100 is illustrated. The latch circuit 100 comprises a tri-state transmission gate 110 and a reverse tri-state transmission gate 120. The tri-state gate 110 and the reverse tri-state gate 120 receive the same complementary control signals cl and cn, which are split from a clock signal ck.

The tri-state gate 110 comprises two PMOS transistors 111, 112 and two NMOS transistors 113, 114 coupled in a cascode arrangement, and receives the complementary control signals cl and cn at the gate electrodes of the lower PMOS transistor 112 and the upper NMOS transistor 113, respectively. An input signal is received at a node 101 between the gate electrodes of the upper PMOS transistor 111 and the lower NMOS transistor 114. An output signal is generated at a node 102 located between the drain electrodes of the lower PMOS transistor 112 and the upper NMOS transistor 113.

The reverse tri-state gate 120 comprises two PMOS transistors 121, 122 and two NMOS transistors 123, 124, coupled in a cascode arrangement, and receives the complementary control signals cn and cl at the gate electrodes of the lower PMOS transistor 122 and the upper NMOS transistor 123, respectively. An input signal, which is the output of the tri-state gate 110 is received via an inverter 130 at the gate electrodes of the upper PMOS transistor 121 and the lower NMOS transistor 124, and an output signal is generated at the node 102, which is connected to the drain electrode of the lower PMOS transistor 122 and the drain electrode of the upper NMOS transistor 123.

When the control cl is low and the control cn is high, the tri-state gate 110 transmits the input signal from the node 101 to the node 102, while the reverse tri-state gate 120 is shut-off. A tri-state transmission gate or a reverse tri-state transmission gate being shut-off means that the tri-state transmission gate or the reverse tri-state transmission gate is in a high-impedance state independent to its input signal. When the control cl is high and the control cn is low, the tri-state gate 110 is shut-off, and the reverse tri-state gate 120 locks the signal at the node 102, i.e. the output of the tri-state gate 110, or the signal at a node 103 located between an output of the inverter 130 and the input of the reverse tri-state gate 120.

At least two factors are likely to slow the node (data storage point) 102 from changing its voltage level when the tri-state gate 110 transmits the input signal from the node 101 to the node 102. First, a sink current is generated at the lower NMOS transistor 124 before the upper NMOS transistor 123 is completely turned OFF when the tri-state gate is driving the node 102 from low to high. Similarly, a sourcing current is generated at the upper PMOS transistor 121 before the low PMOS transistor 122 is completely turned OFF when the tri-state gate 110 is driving the node 102 from high to low. Second, a switch between the lower PMOS transistor 122 and the upper NMOS transistor 123 impacts adversely the voltage at the node 102 from changing state due to the effect of parasitic capacitance. The non-inverted control signal cl is supplied from the clock signal ck via two inverters 133, 135, and the inverted control signal cn is supplied from the clock signal ck via the inverter 133, such that the inverted control signal cn changes faster than the non-inverted control signal cl, which results in relatively large set-up and hold times.

Figure 2A:
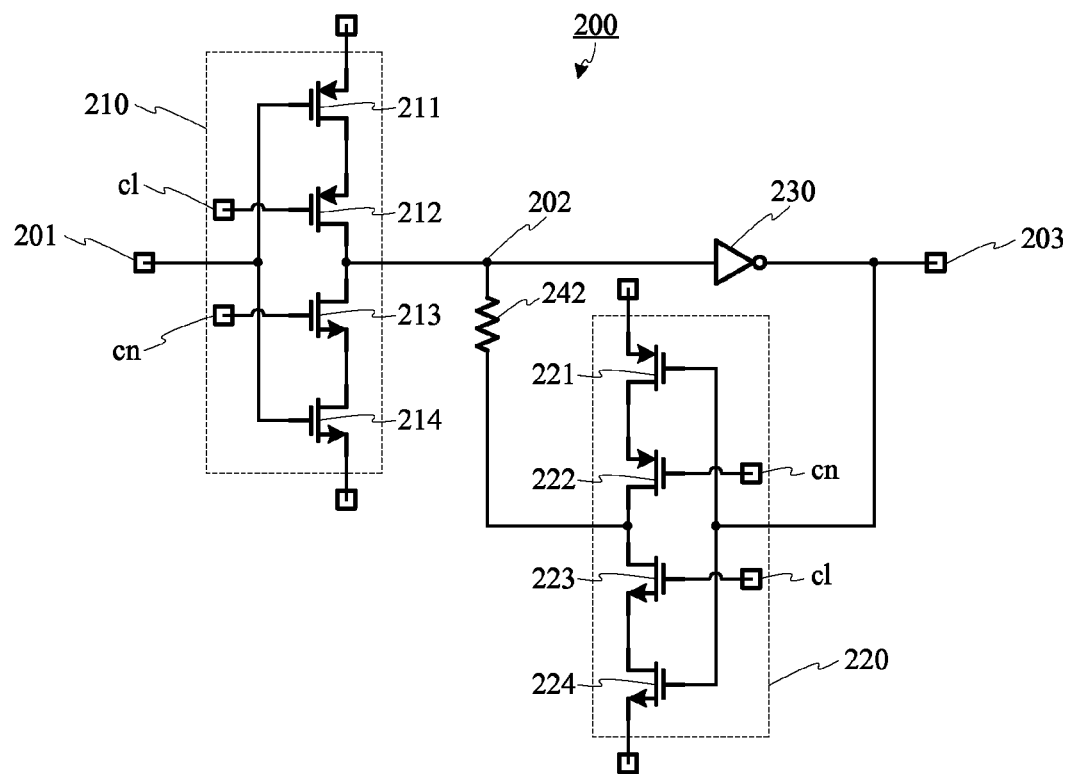
FIGS. 2A and 2B are schematic circuit diagrams of a latch circuit in accordance with an embodiment of the present invention.
Figure 2B:
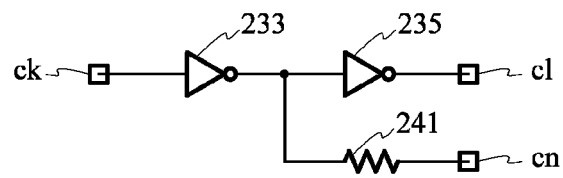

FIGS. 2A and 2B illustrate an exemplary latch circuit 200 of the present invention. The latch circuit 200 comprises a tri-state transmission gate 210 and a reverse tri-state transmission gate 220, and has a structure similar to that of the latch circuit 100, except that, for example, the inverted control signal cn is generated using the inverted clock signal (/ck) via a first undoped polysilicon strip 241, and the output of the reverse tri-state transmission gate 220 is coupled to the node or data storage point 202 via a second undoped polysilicon strip 242. The undoped polysilicon for a CMOS process typically has a sheet resistance within a range from 200 to 1000 ohms/square depending on the specific manufacturing process. In one embodiment, each of the first and second undoped polysilicon strips 241 and 242 has a total resistance more than 200 ohms.

The first undoped strip 241 slows generation of the inverted control signal cn so that it more closely matches generation of the non-inverted control signal cl, and thus the latch 200 has improved set-up and hold times. The second undoped strip 242 acts as a feedback resistor and isolates the output of the reverse tri-state gate 220 from the node (data storage point) 202, i.e., isolating the charging process from discharging process or vice-versa, which improves the signal transition time of the latch circuit 200. The first and second undoped strips 241 and 242 preferably are formed within the doped polysilicon connections by adding a mask process so that the chip layout design is not impacted. As used herein, undoped polysilicon strip means a polysilicon strip having a much softer doping concentration than a doped polysilicon strip that could be used as connection lines.

In some embodiments, a latch circuit having a structure as illustrated in FIGS. 2A and 2B may be simplified by omitting one or the other of the first and second undoped polysilicon strips 241, 242.

Figure 3A:
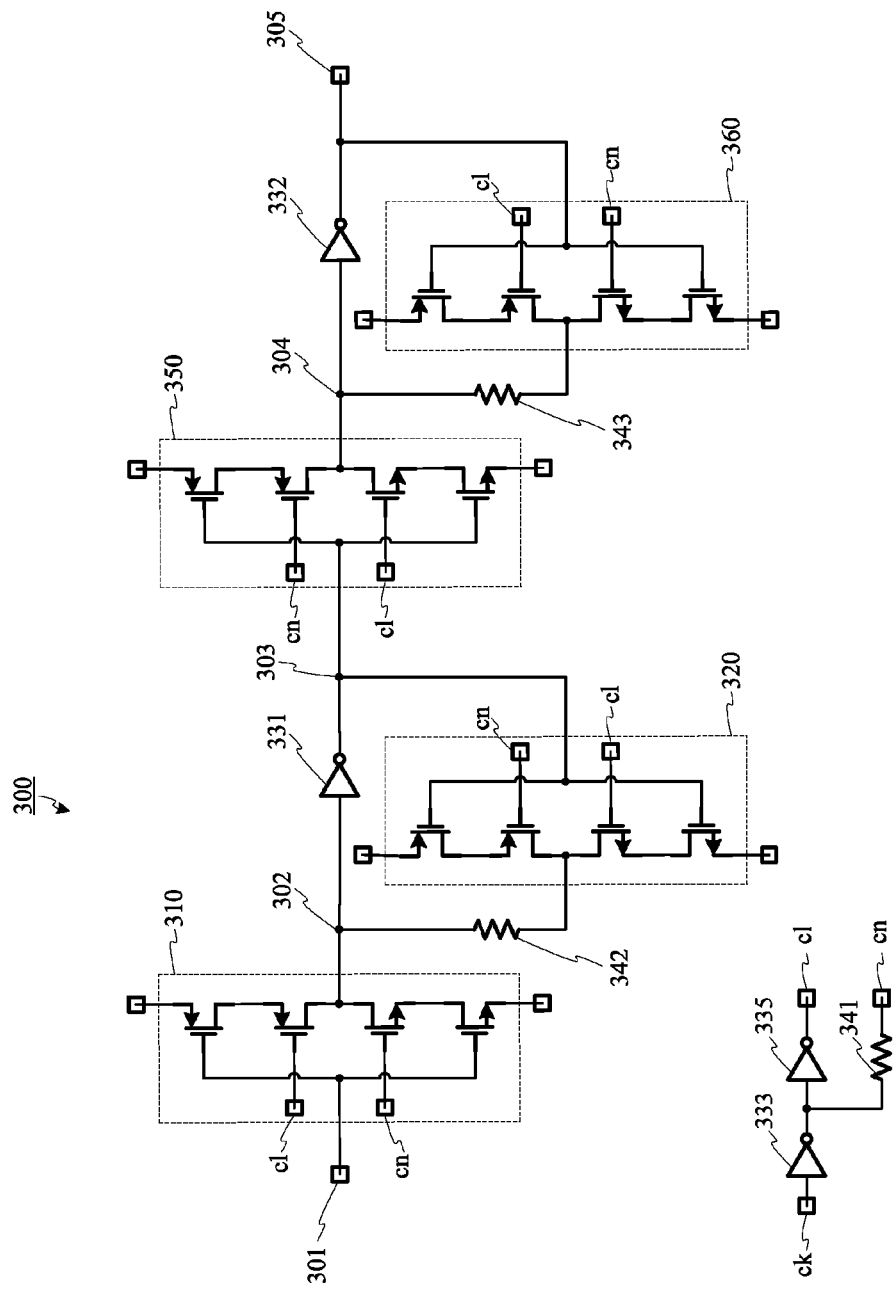
FIG. 3a is a schematic circuit diagram of a master-slave FF in accordance with an embodiment of the present invention and FIG. 3b is a layout diagram of a FF circuit in accordance with an embodiment of the present invention.

FIG. 3a is a schematic circuit diagram of an exemplary flip flop circuit 300 of the present invention. The flip flop circuit 300 comprises first and second series connected latch circuits. The first latch, which may serve as a master latch, includes a first tri-state transmission gate 310 and a first reverse tri-state gate 320. The second latch, which may serve as a slave latch, includes a second tri-state transmission gate 350 and a second reverse tri-state gate 360. The first and second tri-state gates 310, 350 and the first and second reverse tri-state gate 320, 360 share the same complementary control signals cl and cn. That is, a non-inverted control signal cl is generated by passing a clock signal ck through a pair series connected buffers 333 and 335, and an inverted control signal cn is generated from the signal output by a first one of the buffers 333 and a first undoped polysilicon strip 341.

The first tri-state gate 310 receives the non-inverted control signal cl at the gate electrode of a lower PMOS transistor and receives the inverted control cn at the gate electrode of an upper NMOS transistor; the second reverse tri-state gate 360 similarly receives the control signals cn and cl. The first reverse tri-state gate 320 receives the inverted control cn at the gate electrode of a lower PMOS transistor and receives the non-inverted control cl at the gate electrode of an upper NMOS transistor; the second tri-state gate 350 similarly receives the control signals cn and cl. The first reverse tri-state gate 320 is configured to lock the output of the first tri-state gate 310 when the first tri-state gate 310 is shut-off; the second tri-state gate 350 is put in an on/off state opposite to the state of the first tri-state gate 310; and the second reverse tri-state gate 360 is configured to lock the output of the second tri-state gate 350 when the second tri-state gate 350 is shut-off.

The output of the first reverse tri-state transmission gate 320 is coupled to the node (data storage point) 302 via a second undoped polysilicon strip 342. The output of the second reverse tri-state transmission gate 360 is coupled to the data storage point 304 via a third undoped polysilicon strip 343. Generally, each of the first, second and third undoped polysilicon strips 341, 342 and 343 has a sheet resistance within a range from 200 to 1000 ohms/square, and has a total resistance more than 200 ohms. The first undoped strip 341 slows the inverted control signal cn from changing state so that it more closely matches the change in state of the non-inverted control signal cl, and thus the setup and hold performance of the flip flop circuit 300 is improved. The second undoped strip 342 acts as a feedback resistor and isolates the output of the first reverse tri-state gate 320 from the data storage point 302, i.e., isolating the charging process from discharging process or vice-versa, and thus the speed of the change in state of the master latch circuit is improved. The third undoped strip 343 acts and effects the slave latch in a similar manner as the second undoped strip 342 effects the master latch.

The first, second and third undoped strips 341, 342 and 343 may be formed within the doped polysilicon connections of the circuit by adding a mask process without changing the chip layout design. The flip flop circuit 300 has shorter CQ delay (Clock to Q Delay), improved set-up and hold times, and less metal wiring, which leaves more metal routing tracks available for place and route of the whole circuit.

Figure 3B:
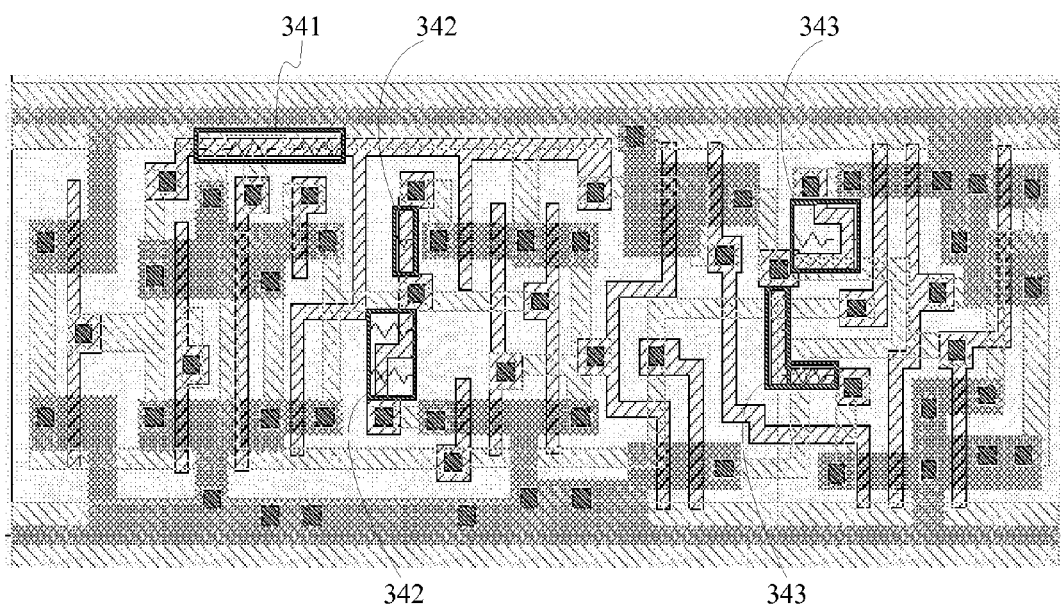

FIG. 3b illustrates the layout of the flip-flop circuit 300. As illustrated in FIG. 3b, the portion with hatched lines running upward from right to left represents metal connections, the meshed portion represents an active doped region, and the portion with hatched lines running upward from left to right represents a polysilicon region. Generally, polysilicon regions may be used to replace some metal connections in a circuit to facilitate the layout design. Also, reducing metal connections inside a flip-flop circuit can leave more metal routing tracks above the flip-flop circuit, which allows for improved SOC routability. The first, second and third undoped polysilicon strips 341, 342 and 343 are highlighted in boxes, and are formed within the polysilicon region by adding a mask process, without having to change the layout design. The added mask defines the region of poly that should be more lightly doped than the rest of poly, which is usually heavily doped to reduce poly resistance.

In some other embodiments, a flip flop circuit having a structure as illustrated in FIG. 3a may be simplified with one or two of the three undoped polysilicon strips omitted.

Figure 4:
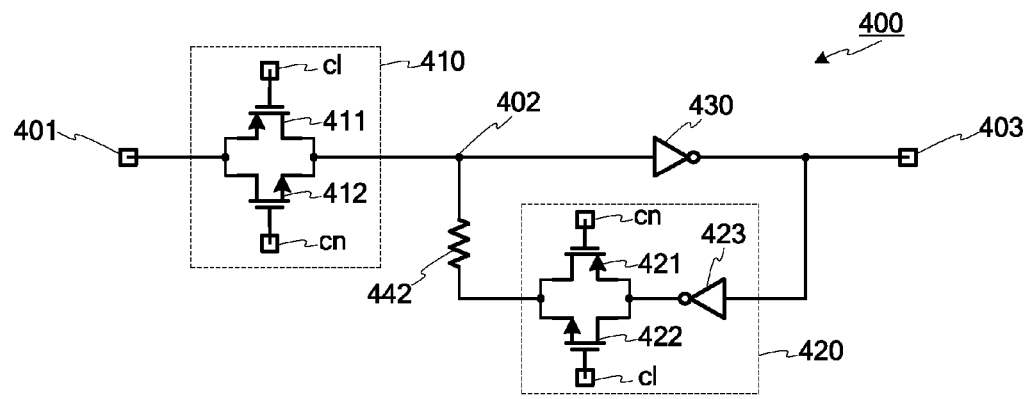
FIG. 4 is a schematic circuit diagram of a FF circuit in accordance with another embodiment of the present invention.

FIG. 4 is a schematic circuit diagram of another exemplary latch circuit 400 of the present invention. As illustrated, the latch circuit 400 comprises a tri-state transmission gate 410 and a reverse tri-state transmission gate 420 sharing the same complementary control signals cl and cn.

The tri-state gate 410 comprises a PMOS transistor 411 and an NMOS transistor 412, receives the non-inverted control cl at the gate electrode of the PMOS transistor 411, receives the inverted control cn at the gate electrode of the NMOS transistor 412, receives an input signal from a node 401 at the source electrode of the PMOS transistor 411 and the drain electrode of the NMOS transistor 412, and provides an output at a data storage point 402 at the drain electrode of the PMOS transistor 411 and the source electrode of the NMOS transistor 412.

The reverse tri-state gate 420 comprises a PMOS transistor 421, an NMOS transistor 422 and an inverter 423, receives the inverted control cn at the gate electrode of the PMOS transistor 421, receives the non-inverted control cl at the gate electrode of the NMOS transistor 422, receives an input signal from a node 403 via the inverter 423 at the source electrode of the PMOS transistor 421 and the drain electrode of the NMOS transistor 422, and provides an output at the data storage point 402 via an undoped polysilicon strip 442 at the drain electrode of the PMOS transistor 421 and the source electrode of the NMOS transistor 422. The connections to the clock signal ck are similar to those of the latch circuit 200 and the flip flop circuit 300, and thus further description thereof is omitted for simplicity.

When the control cl is low and the control cn is high, the tri-state gate 410 transmits the voltage signal from the node 401 to 402, while the reverse tri-state gate 420 is shut-off. When the control cl is high and the control cn is low, the tri-state gate 410 is shut-off, and the reverse tri-state gate 420 locks the signal at the node 402, i.e., the output of the tri-state gate 410, or the signal at the node 403, which is opposite to the output of the tri-state gate 410. The reverse tri-state gate 420 is configured to lock the output of the tri-state gate 410 when the tri-state gate 410 is shut-off.

Figure 5:
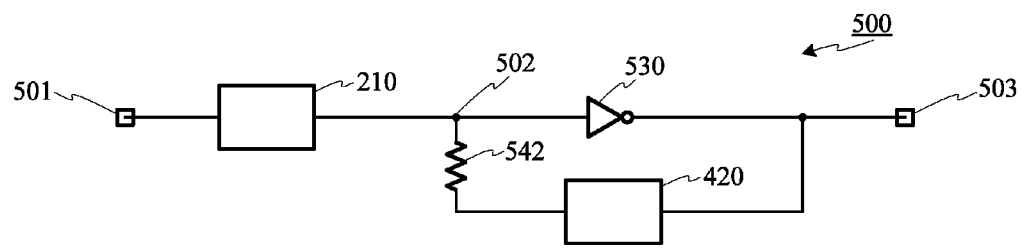
FIG. 5 is a schematic circuit diagram of still another exemplary latch circuit of the present invention.

FIG. 5 illustrates still another exemplary latch circuit 500 of the present invention. The latch circuit 500 comprises a tri-state transmission gate 210 as illustrated in FIG. 2A, and a reverse tri-state transmission gate 420 as illustrated in FIG. 4. The reverse tri-state gate 420 provides an output at a node (data storage point) 502 via an undoped polysilicon strip 542. The reverse tri-state gate 420 is configured to lock the output of the tri-state gate 210 when the tri-state gate 210 is shut-off.

Figure 6:
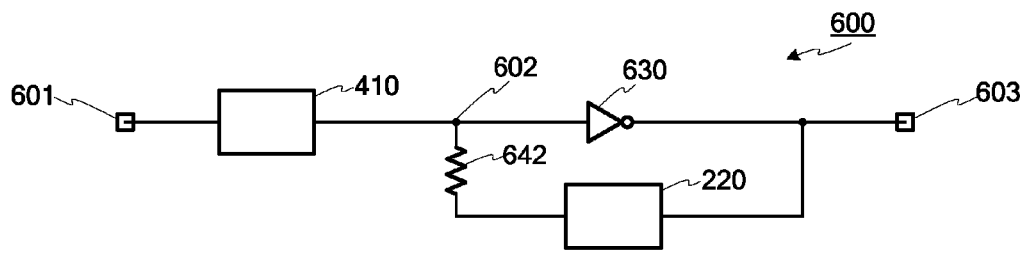
FIG. 6 is a schematic circuit diagram of yet another exemplary latch circuit of the present invention.

FIG. 6 illustrates yet another exemplary latch circuit 600 of the present invention. The latch circuit 600 comprises a tri-state transmission gate 410 as illustrated in FIG. 4, and a reverse tri-state transmission gate 220 as illustrated in FIG. 2A. The reverse tri-state gate 220 provides an output at a node (data storage point) 602 via an undoped polysilicon strip 642. The reverse tri-state gate 220 is configured to lock the output of the tri-state gate 410 when the tri-state gate 410 is shut-off.

It will be appreciated by those skilled in the art that any feasible tri-state gate and reverse tri-state gate with other structures could be used to replace the tri-state gates 210, 310, 410 and the reverse tri-state gates 220, 320, 420 in the above embodiments.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:
1. A latch circuit, comprising:
   a tri-state gate having an input, an output, and receiving complementary control signals;
   a reverse tri-state gate having an input, an output, and sharing the complementary control signals with the tri-state gate, wherein the reverse tri-state gate is configured to lock an output of the tri-state gate when the tri-state gate is shut-off;
   a first undoped polysilicon strip for generating one of the complementary control signals; and
   a second undoped polysilicon strip coupled between the output of the tri-state gate and the output of the reverse tri-state gate.
2. The latch circuit of claim 1, wherein each of the first and second undoped polysilicon strips has a resistance more than 200 ohms.
3. The latch circuit of claim 1, wherein the tri-state gate comprises:
   upper and lower PMOS transistors in cascode arrangement with upper and lower NMOS transistors,
   wherein the tri-state gate receives the complementary control signals at the gate electrodes of the lower PMOS transistor and the upper NMOS transistor, receives input signal at the gate electrodes of the upper PMOS transistor and the lower NMOS transistor, and provides the output at the drain electrodes of the lower PMOS transistor and the upper NMOS transistor.
4. The latch circuit of claim 1, wherein the tri-state gate comprises:
   a PMOS transistor; and
   a NMOS transistor, wherein the source and drain of the NMOS transistor are coupled to the drain and source of the PMOS transistor, respectively, and
   wherein the tri-state gate receives the complementary control signals at the gate electrodes of the PMOS transistor and the NMOS transistor, receives the input signal at the source electrode of the PMOS transistor and the drain electrode of the NMOS transistor, and provides the output at the drain electrode of the PMOS transistor and the source electrode of the NMOS transistor.

5. A latch circuit, comprising:
a tri-state gate having an input, an output, and receiving complementary control signals;
a reverse tri-state gate having an input connected to an output of the tri-state gate, an output, and sharing the complementary control signals with the tri-state gate;
an inverter connected between the output of the tri-state gate and the input of the reverse tri-state gate, wherein the reverse tri-state gate locks an output of the tri-state gate when the tri-state gate is shut-off;
a first undoped polysilicon strip that receives a clock signal and generates one of the complementary control signals; and
a second undoped polysilicon strip coupled between the output of the tri-state gate and the output of the reverse tri-state gate.

6. A flip-flop circuit, comprising:
a first latch circuit having:
 a first tri-state gate having an input, an output and receiving complementary control signals; and
 a first reverse tri-state gate having an input, an output and sharing the complementary control signals with the first tri-state gate, wherein the first reverse tri-state gate is configured to lock an output of the first tri-state gate when the first tri-state gate is shut-off; and
a second latch circuit connected in series with the first latch circuit, the second latch circuit having:
 a second tri-state gate that shares the complementary control signals with the first tri-state gate, wherein the second tri-state gate is configured to be in an on/off state opposite to the first tri-state gate; and
 a second reverse tri-state gate that shares the same complementary control signals with the first tri-state gate, wherein the second reverse tri-state gate is configured to lock an output of the second tri-state gate when the second tri-state gate is shut-off,
wherein the complementary control signals comprise a first undoped polysilicon strip, and the output of the first reverse tri-state gate is coupled to the output of the first tri-state gate via a second undoped polysilicon strip, and the output of the second reverse tri-state gate is coupled to the output of the second tri-state gate via a third undoped polysilicon strip.

7. The flip flop circuit of claim 6, wherein each of the first, second and third undoped polysilicon strips has a resistance more than 200 ohms.

8. The flip flop circuit of claim 6, wherein at least one of the first and second tri-state gates comprises:
upper and lower PMOS transistors in cascode arrangement with upper and lower NMOS transistors;
wherein the at least one of the first and second tri-state gates receives the complementary control signals at the gate electrodes of the lower PMOS transistor and the upper NMOS transistor, receives the input signal at the gate electrodes of the upper PMOS transistor and the lower NMOS transistor, and provides the output at the drain electrodes of the lower PMOS transistor and the upper NMOS transistor.

9. The flip flop circuit of claim 6, wherein at least one of the first and second reverse tri-state gates comprises:
a PMOS transistor; and
a NMOS transistor, wherein the source and drain of the NMOS transistor are coupled to the drain and source of the PMOS transistor, respectively, and
wherein the at least one of the first and second reverse tri-state gates receives the complementary control signals at the gate electrodes of the PMOS transistor and the NMOS transistor, receives the input signal at the source electrode of the PMOS transistor and the drain electrode of the NMOS transistor, and provides the output at the drain electrode of the PMOS transistor and the source electrode of the NMOS transistor.

* * * * *